United States Patent [19]

Yagi et al.

[11] Patent Number: 5,272,362
[45] Date of Patent: Dec. 21, 1993

[54] SEMICONDUCTOR LIGHT EMITTING DEVICE

[75] Inventors: Tetsuya Yagi; Tsuneo Okada, both of Itami, Japan

[73] Assignee: Mitsubishi Denki Kabushiki Kaisha, Tokyo, Japan

[21] Appl. No.: 828,225

[22] Filed: Jan. 30, 1992

[30] Foreign Application Priority Data

Feb. 12, 1991 [JP] Japan .................. 3-42706

[51] Int. Cl.$^5$ .................. H01L 29/78; H01L 33/00
[52] U.S. Cl. .................. 257/102; 257/94; 257/96
[58] Field of Search .................. 357/17; 257/102, 94, 257/96, 13, 14, 15, 17, 22

[56] References Cited

U.S. PATENT DOCUMENTS

| | | | |
|---|---|---|---|
| 4,416,012 | 11/1983 | Botez et al. | 372/45 |
| 4,461,007 | 7/1984 | Burnham et al. | 372/45 |
| 4,551,394 | 11/1985 | Betsch et al. | 428/691 |
| 4,701,774 | 10/1987 | McIlroy et al. | 357/17 |
| 5,055,893 | 10/1991 | Sasagawa | 357/17 |
| 5,107,317 | 4/1992 | Takasaki | 357/39 |

FOREIGN PATENT DOCUMENTS

| | | | |
|---|---|---|---|
| 0166498 | 1/1986 | European Pat. Off. | 357/17 |
| 0227865 | 7/1987 | European Pat. Off. | 357/17 |
| 0284684 | 10/1988 | European Pat. Off. | 372/45 |
| 0301807 | 2/1989 | European Pat. Off. | 357/38 |
| 63-240083 | 10/1988 | Japan | 357/17 |
| 2070859 | 9/1981 | United Kingdom | 257/102 |
| 2200248 | 7/1988 | United Kingdom | 372/45 |
| 2225671 | 6/1990 | United Kingdom | 372/45 |

OTHER PUBLICATIONS

Horiuchi et al, "A New LED Structure With A Self-Aligned Sphere Lens For Efficient Coupling To Optical Fibers", IEEE Transactions on Electron Devices, vol. ED-24, No. 7, Jul. 1977, pp. 986–990.

*Primary Examiner*—Jerome Jackson
*Assistant Examiner*—Stephen D. Meier
*Attorney, Agent, or Firm*—Leydig, Voit & Mayer

[57] ABSTRACT

An AlGaAs/GaAs system light emitting device includes a GaAs substrate doped with a first conductivity type impurity, a first conductivity type $Al_yGa_{1-y}As$ first cladding layer, an $Al_xGa_{1-x}As$ ($0 < x < y$) active layer, and an $Al_yGa_{1-y}As$ second cladding layer having a second conductivity type opposite to the first conductivity type successively disposed on the substrate. The light emitting device includes an $Al_zGa_{1-z}As$ ($z \geq 0$) buffer layer which is disposed between the GaAs substrate and the first cladding layer containing a dopant impurity in such a high concentration that the intensity of photoluminescent light generated due to the band-to-band transitions is reduced and has a smaller energy band gap than the energy of the light emitted from the light emitting device. Therefore, a long lifetime semiconductor light emitting device having no sub peak in the light emission spectrum can be easily produced with good yield.

16 Claims, 11 Drawing Sheets ic light emitting device. In FIG. 10, reference
SEMICONDUCTOR LIGHT EMITTING DEVICE

FIELD OF THE INVENTION

The present invention relates to an AlGaAs/GaAs system semiconductor light emitting device.

BACKGROUND OF THE INVENTION

FIG. 10 is a cross-sectional view of a prior art semiconductor light emitting device. In FIG. 10, reference numeral 1 designates an n type (hereinafter, referred to as 'n-') GaAs substrate. An n-Al$_{0.35}$Ga$_{0.65}$As first cladding layer 2 is disposed on the n-GaAs substrate 1. A p type (hereinafter, referred to as 'p-') Al$_{0.06}$Ga$_{0.94}$As active layer 3 is disposed on the n-Al$_{0.35}$Ga$_{0.65}$As first cladding layer 2. A p-Al$_{0.35}$Ga$_{0.65}$As second cladding layer 4 is disposed on the p-Al$_{0.06}$Ga$_{0.94}$As active layer 3. An n-Al$_{0.10}$Ga$_{0.90}$As contact layer 5 is disposed on the p-Al$_{0.35}$Ga$_{0.65}$As second cladding layer 4. A contact hole 7 is produced at the center of the contact layer 5. The contact layer 5 is doped to produce a Zn diffused p$^+$ region 6, the diffusion depth of which is controlled such that the diffusion front reaches into the p-Al$_{0.35}$Ga$_{0.65}$As second cladding layer 4 at a region under the contact hole 7 while it remains within the n-Al$_{0.10}$Ga$_{0.90}$As contact layer 5 at the other regions.

A description is given of the operation.

A bias is applied between the Zn diffused p$^+$ region 6 of the n-Al$_{0.10}$Ga$_{0.90}$As contact layer 5 and the n-GaAs substrate 1 with the former as positive side. No current flows at regions where the contact hole 7 is not produced because a pnpn junction is present on the device, while a current flows at the region where the contact hole 7 is produced because the n-Al$_{0.10}$Ga$_{0.90}$As contact layer 5 is converted into the p$^+$ region due to the Zn diffusion and only a pn junction is formed between the p-Al$_{0.06}$Ga$_{0.94}$As active layer 3 and the n-Al$_{0.35}$Ga$_{0.65}$As first cladding layer 2 which are biased by the bias voltage in a forward direction. Thus, the current flows along the current path 8 shown in FIG. 10. Holes and electrons injected into the p-Al$_{0.06}$Ga$_{0.94}$As active layer 3 due to the current 8 recombine and radiate light. The light has an energy corresponding to the energy band gap of the material constituting the active layer. For example, when the active layer is constituted by Al$_{0.06}$Ga$_{0.94}$As, the peak wavelength of the light is approximately 830 nm.

In the prior art semiconductor light emitting device, light generated in the p-Al$_{0.06}$Ga$_{0.94}$As active layer 3 and spreading in a direction toward the substrate excites the n-GaAs substrate 1 and electron-hole pairs are generated in the n-GaAs substrate 1. Since the n-GaAs substrate is generally produced by a horizontal Bridgman (HB) method, it cannot have a high dopant concentration and it is usually doped at a concentration of around $1 \sim 3 \times 10^{18}$cm$^{-3}$. In this carrier concentration, the intensity of photoluminescence (hereinafter, referred to as PL) light generated due to the band to band transitions is strong. Accordingly, the electron-hole pairs are excited in the n-GaAs substrate 1 by the light spreading from the p-Al$_{0.06}$Ga$_{0.94}$As active layer 3 in a direction toward the substrate and recombine in the substrate, so that the band to band transitions of GaAs occur and generate PL light at a wavelength of 870 nm. As a result, light generated in the active layer 3 with the PL light superposed thereon is emitted from the device. FIG. 11 shows a spectrum of the light emitted from the device. As shown in FIG. 11, the spectrum has a main peak at 830 nm followed by a sub peak of 870 nm. The semiconductor light emitting device having such spectrum cannot be used for the optical communication including multiple wavelengths, such as three wavelengths of 830 nm, 850nm, and 870 nm, because interference arises therebetween.

FIG. 12 is a cross-sectional view illustrating a construction of a prior art light emitting diode (hereinafter, referred to as LED) capable of suppressing the sub peak in the light emission intensity, disclosed in Japanese Published Patent Application 63-240083. In FIG. 12, the same reference numerals as those of FIG. 10 designate the same or corresponding portions. Reference numeral 102 designates a non-doped GaAs layer of less than $1 \times 10^{16}$cm$^{-3}$ dopant concentration, disposed between the n-GaAs substrate 1 and the n-AlGaAs cladding layer 2. FIG. 13 is a diagram showing the relation between the dopant concentration of the GaAs layer and the intensity of PL light.

As shown in FIG. 13, the PL intensity of the GaAs layer of less than $1 \times 10^{16}$cm$^{-3}$ dopant concentration is less than a hundredth of that of the GaAs layer of approximately $1 \sim 3 \times 10^{18}$cm$^{-3}$ dopant concentration, which is generally used as a substrate. In this prior art LED, the non-doped GaAs layer 102 of less than $1 \times 10^{16}$cm$^{-3}$ dopant concentration is provided between the n-GaAs substrate 1 and the n-AlGaAs cladding layer 2 and almost all of the light generated in the active layer 3 and spreading in a direction toward the substrate 1 is dissipated by recombinations which do not contribute to the light emission in the non-doped GaAs layer 100, thereby suppressing the sub peak in the light emission intensity.

The prior art LED that suppresses the sub peak in the light emission intensity constituted as described above has the following problems.

Firstly, at the time of growing the non-doped layer, a low dopant concentration layer can be produced in a clean growth equipment. However, it cannot be produced when the growth equipment is contaminated by the impurities from repeated growths. Therefore, the inside of the growth equipment must be always kept clean, thereby resulting in low productivity.

Secondly, even when the non-doped layer is produced in an epitaxial growth process, the impurities diffuse from the n-GaAs substrate of $1 \sim 3 \times 10^{18}$cm$^{-3}$ dopant concentration and the n-AlGaAs cladding layer of $1 \sim 5 \times 10^{17}$cm$^{-3}$ dopant concentration to the non-doped layer in the following annealing process such as a Zn diffusion process, and thus the dopant concentration of the non-doped layer is raised. Therefore, the PL intensity increases and the light emission intensity has a sub peak.

Thirdly, the insertion of the non-doped layer increases the series resistance of the element and this increases the power consumption. Thus, element deterioration is accelerated and lifetime is shortened.

SUMMARY OF THE INVENTION

It is an object of the present invention to provide a semiconductor light emitting device that has no sub peak in the light emission spectrum and that has a good productivity and a long lifetime.

Other objects and advantages of the present invention will become apparent from the detailed description given hereinafter; it should be understood, however that the detailed description and specific embodiment are given by way of illustration only, since various changes and modifications within the spirit and the scope of the invention will become apparent to those skilled in the art from this detailed description.

According to a first aspect of the present invention, a semiconductor light emitting device includes an $Al_z Ga_{1-z}As$ ($0 \leq z$) buffer layer disposed between a GaAs substrate and an AlGaAs cladding layer disposed at the substrate side. This buffer layer has a smaller energy band gap than the photon energy emitted by the light emitting device itself, and has such a high impurity concentration that the intensity of photoluminescence light generated due to band to band transitions is small. Therefore, light generated in an active layer and spreading in a direction toward the substrate is absorbed by the buffer layer before reaching the substrate. Further, the intensity of PL light generated by recombinations of electron-hole pairs which are generated in the buffer layer and excited by the light from the active layer is extremely low, thereby preventing a sub peak in the light emission spectrum of the semiconductor light emitting device.

According to a second aspect of the present invention, a semiconductor light emitting device includes a buffer layer that has a smaller energy band gap than that of the light energy emitted by the light emitting device itself and has an indirect transition type energy band structure, which is inserted between a GaAs substrate and an AlGaAs cladding layer disposed at the substrate side. Therefore, light generated in an active layer and spreading in a direction toward the substrate is absorbed by the buffer layer before reaching the substrate. Further, some of electron-hole pairs produced in the buffer layer excited by the light from the active layer hardly cause band to band transition light emission, thereby preventing a sub peak in the light emission spectrum of the semiconductor light emitting device.

According to a third aspect of the present invention, a semiconductor light emitting device includes an $Al_z Ga_{1-z}As$ ($0 \leq z$) buffer layer disposed between a GaAs substrate and an AlGaAs cladding layer disposed at the substrate side, containing dopant impurities to such concentration that the peak energy of photoluminescence light is almost the same as the energy of the light emitted by the light emitting device itself. Therefore, light generated in an active layer and spreading in a direction toward the substrate is absorbed by the buffer layer before reaching the substrate. Further, the peak energy of PL light generated by the recombinations of the electron-hole pairs produced in the buffer layer excited by the light from the active layer is almost the same as the light energy emitted by the semiconductor light emitting device itself, thereby preventing a sub peak in the light emission spectrum of the semiconductor light emitting device.

DETAILED DESCRIPTION OF THE PREFERRED EMBODIMENTS

An embodiment of the present invention will be described in detail with reference to the drawings.

Figure 1:
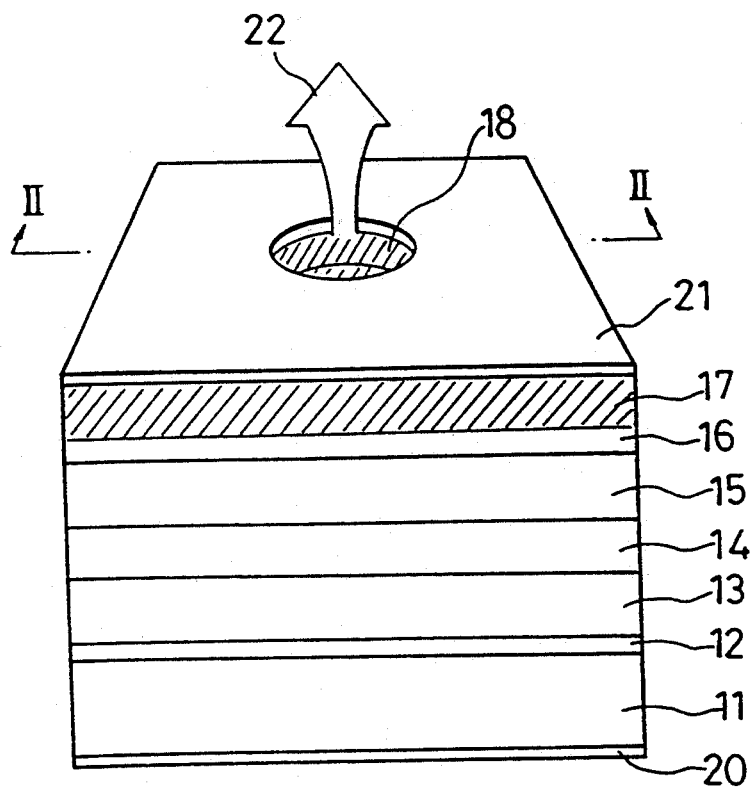
FIG. 1 is a perspective view illustrating a semiconductor light emitting device in accordance with a first embodiment of the present invention.

FIG. 1 is a perspective view illustrating a construction of a semiconductor light emitting device in accordance with a first embodiment of the present invention. In FIG. 1, reference numeral 11 designates an n-GaAs substrate on which an n+-GaAs buffer layer 12 containing Se as an n type impurity in a high concentration is disposed. An n-$Al_{0.35}Ga_{0.65}As$ first cladding layer 13 is disposed on the n+-GaAs buffer layer 12. A p-$Al_{0.06}Ga_{0.94}As$ active layer 14 is disposed thereon. A p-$Al_{0.35}Ga_{0.65}As$ second cladding layer 15 is disposed on the p-$Al_{0.06}Ga_{0.94}As$ active layer 14 and an n-$Al_{0.10}Ga_{0.90}As$ contact layer 16 is disposed thereon. A contact hole 18 having a predetermined depth is produced at a central portion of the contact layer 16. An n side electrode 20 is produced on the rear surface of the substrate 11 and a p side electrode 21 is produced on the surface of the contact layer 16 except for the contact hole. Reference numeral 17 designates a p+ region produced in the contact layer 16 by Zn diffusion.

As to typical thicknesses of respective layers, the contact layer 16 is about 3 microns, the second cladding layer 15 about 2 microns, the active layer 14 about 1 micron, the first cladding layer 13 about 2 microns, and the buffer layer 12 about 0.2 micron. The contact hole 18 has about 35 micron diameter and about 2 micron depth.

Figure 2:
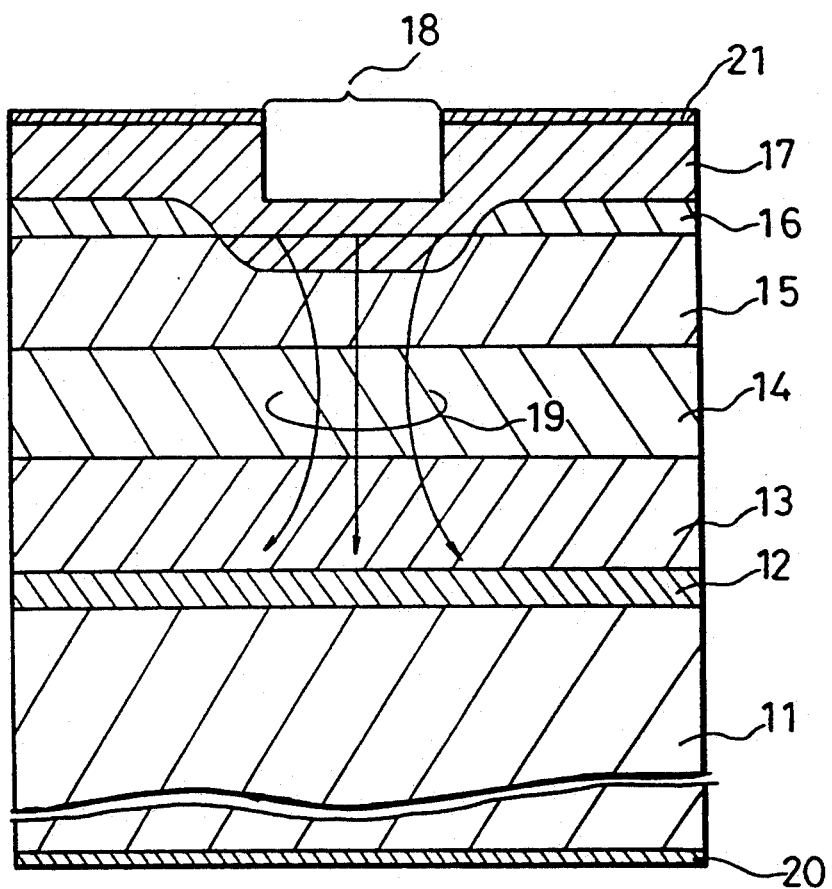
FIG. 2 is a cross-sectional view of the semiconductor light emitting device in a line II—II of FIG. 1.

FIG. 2 is a cross-sectional view of the semiconductor light emitting device in a line II—II of FIG. 1. As shown in FIG. 2, a Zn diffusion region 17 has a diffusion depth controlled such that the diffusion front reaches into the p-$Al_{0.35}Ga_{0.65}As$ second cladding layer 15 at a region under the contact hole 18 while it is within the n-$Al_{0.10}Ga_{0.90}As$ contact layer 16 elsewhere.

A description is given of the operation.

A bias is applied between the Zn diffused p+ region 17 of the n-Al$_{0.10}$Ga$_{0.90}$As contact layer 16 and the n-GaAs substrate 11 with the former as positive side. No current flows at regions where the contact hole 18 is produced because a pnpn junction is produced in the device. A current flows at the region where the contact hole 18 is produced because the n-Al$_{0.10}$Ga$_{0.90}$As contact layer 16 is converted into the p+ region due to the Zn diffusion and only a pn junction is formed between the p-Al$_{0.06}$Ga$_{0.94}$As active layer 14 and the n-Al$_{0.35}$Ga$_{0.65}$As first cladding layer 13 which are biased by the bias voltage in a forward direction. Thus, the current flows in a current path 19 shown in FIG. 2. Holes and electrons injected into the p-Al$_{0.06}$Ga$_{0.94}$As active layer 14 due to the current 19 recombine and radiate light. The light has an energy corresponding to the energy band gap of the material constituting the active layer. For example, when the active layer is constituted by Al$_{0.06}$Ga$_{0.94}$As, the peak wavelength of the light is approximately 830 nm.

Figure 3:
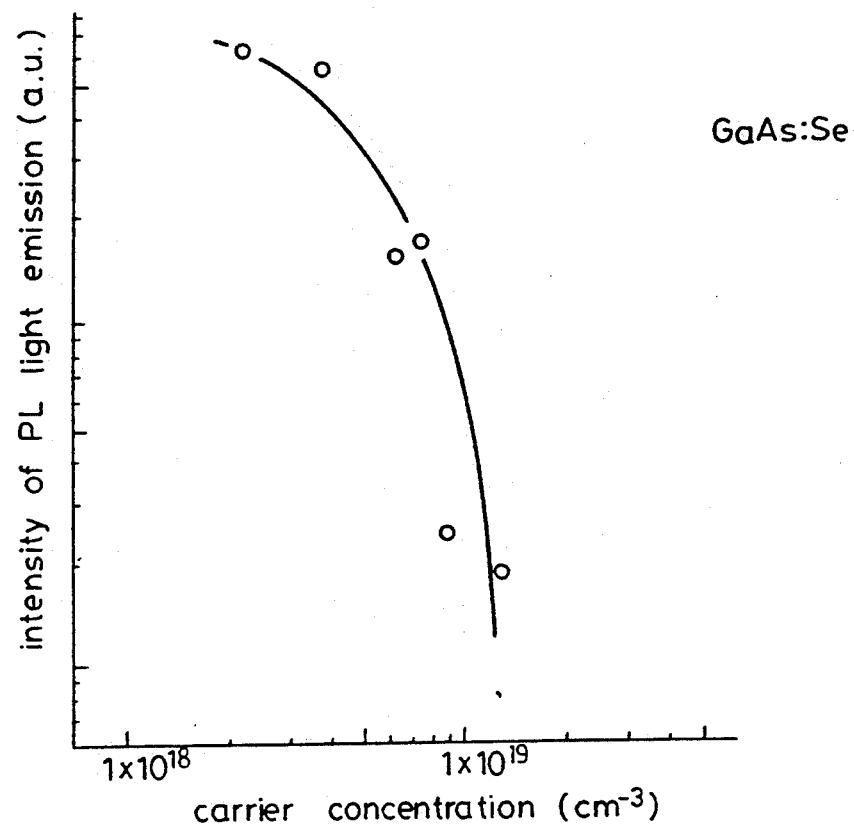
FIG. 3 is a diagram showing the relation between the intensity of PL light generated by band to band transition and carrier concentration in n-GaAs.
Figure 4:
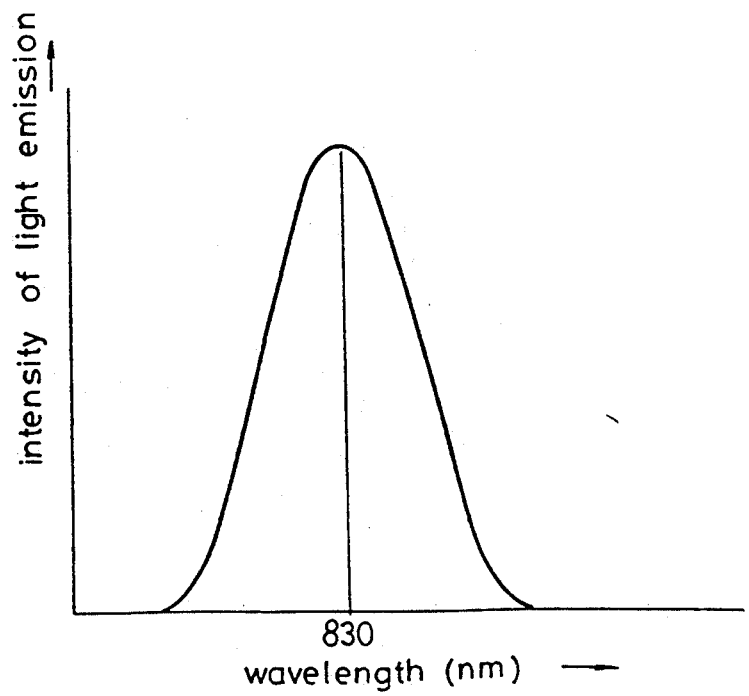
FIG. 4 is a diagram illustrating a light emission spectrum of a semiconductor light emitting device in accordance with the first embodiment of the present invention.
Figure 13:
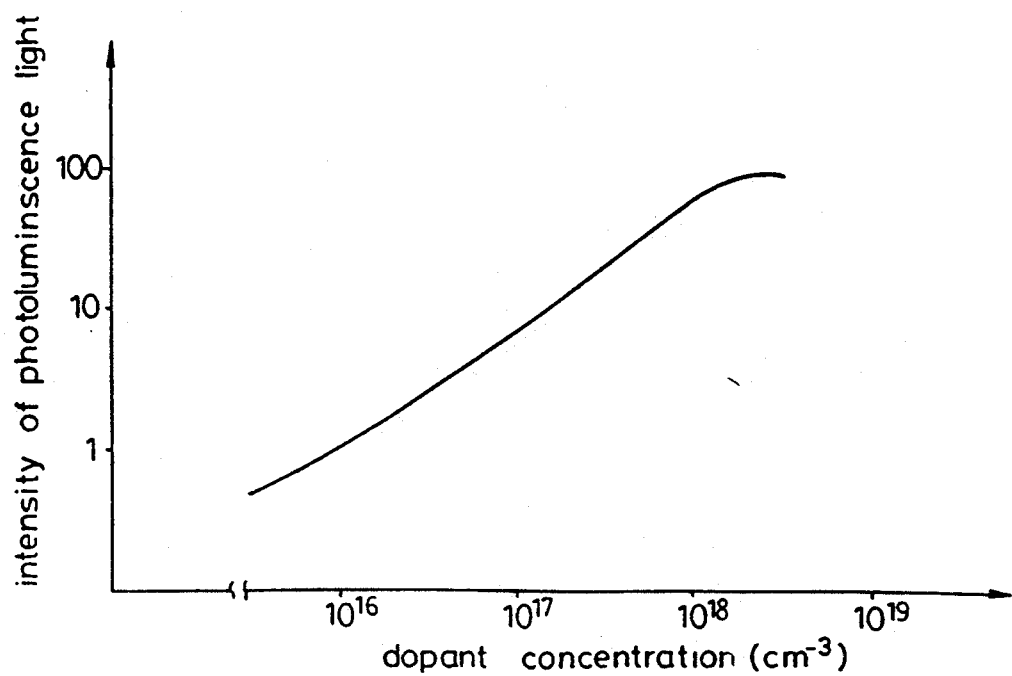
FIG. 13 is a diagram showing the relation between the intensity of PL light generated by band to band transitions and the carrier concentration in n-GaAs.

In this first embodiment, disposed on the n-GaAs substrate 11 is n+-GaAs buffer layer 12 containing Se as an n type impurity in a concentration of about $1 \times 10^{19}$ cm$^{-3}$. In the relation between the intensity of PL light generated by band to band transitions and the carrier concentration in n-GaAs, the PL light intensity increases with an increase of the carrier concentration in a range of carrier concentration from the order of $10^{16}$ cm$^{-3}$ to of $10^{18}$ cm$^{-3}$ as shown in FIG. 13. However, when the carrier concentration is higher than $10^{18}$ cm$^{-3}$, the PL light intensity decreases as the carrier concentration increases as shown in FIG. 3. When the carrier concentration exceeds $5 \times 10^{18}$ cm$^{-3}$, the band to band transition light emission can seldom be seen. Accordingly, in this embodiment, the n+-GaAs buffer layer 12 is excited by the light spreading from the p-Al$_{0.06}$Ga$_{0.94}$As active layer 14 in a direction toward the substrate, so that electron-hole pairs are generated in the active layer 14. However, the band to band transition light emission seldom occurs because the buffer layer 12 has sufficiently high carrier concentration. As a result, light is only emitted from the active layer and the light emission spectrum has no sub peak as shown in FIG. 4.

In the above-described first embodiment, since the n+-GaAs buffer layer having a sufficiently high carrier concentration is disposed on the substrate, the light generated in the active layer and spreading in a direction toward the substrate is absorbed by the buffer layer before reaching the substrate, and the electron-hole pairs produced in the buffer layer excited by the light from the active layer do not cause the band to band transition light emission, thereby preventing a sub peak in the light emission spectrum of the semiconductor light emitting device. In addition, since the contamination of the inside of the growth equipment due to the impurities hardly affects the growth of a layer having a high carrier concentration, the production process can be easily repeated, thereby enhancing productivity. As compared with the prior art LED including the non-doped buffer layer between the substrate and the cladding layer, the annealing process after producing the buffer layer effects less influence and the characteristics are not deteriorated thereby. Furthermore, as compared with the LED provided with the non-doped buffer layer, the series resistance of the element can be reduced, thereby reducing the electrical power consumption and preventing the element deterioration due to the heat generation. This makes it possible to produce an element having a long lifetime.

In the above-described embodiment GaAs is used as material of the buffer layer, but AlGaAs which has a smaller energy band gap than that of the material constituting the active layer may be used.

Next, a second embodiment of the present invention will be described.

Figure 5:
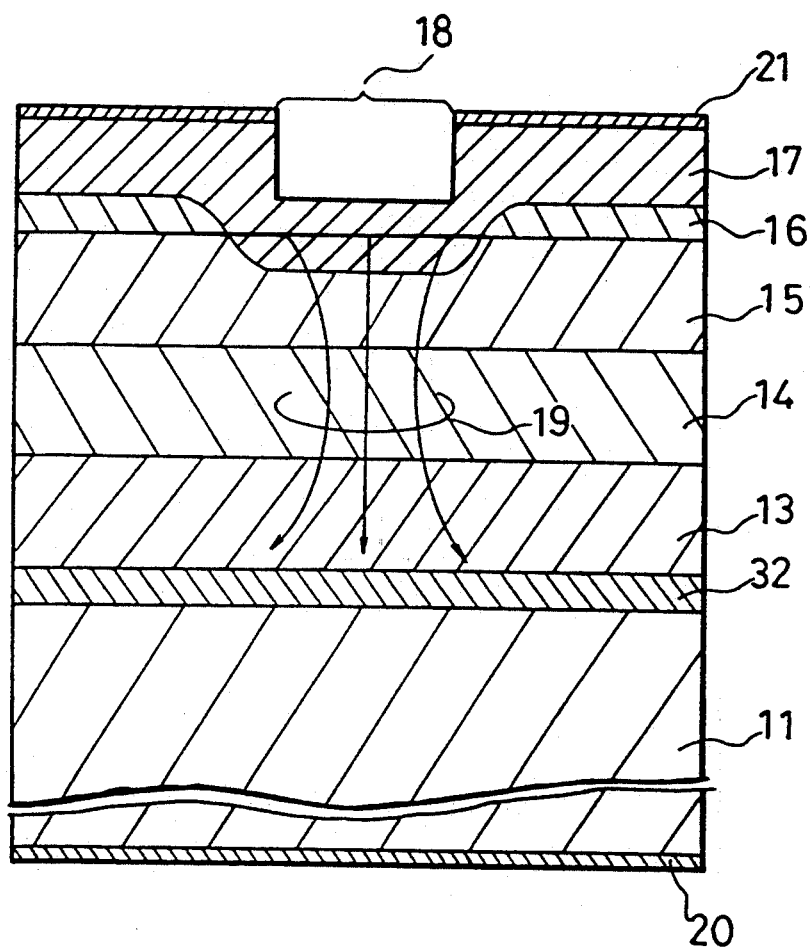
FIG. 5 is a cross-sectional view illustrating a semiconductor light emitting device in accordance with a second embodiment of the present invention.

FIG. 5 is a cross-sectional view illustrating a semiconductor light emitting device in accordance with the second embodiment of the present invention. In FIG. 5, the same reference numerals as those of FIGS. 1 and 2 designate the same or corresponding portions. An n-Ge buffer layer 32 is disposed on the substrate 11.

The typical thicknesses of layers other than the buffer layer 32 are the same as those of the first embodiment. The thickness of the n-Ge buffer layer 32 is about 1 micron, i.e., larger than that of the buffer layer 12 of the first embodiment because the light absorption of Ge is smaller than that of GaAs. The diameter and the depth of the contact hole 18 are the same as those of the first embodiment.

A description will be given of the operation.

A bias is applied between the Zn diffusion region 17 at the surface of the n-Al$_{0.10}$Ga$_{0.90}$As contact layer 16 and the n-GaAs substrate 11 with the former as positive side. No current flows at regions where the contact hole 18 is produced because a pnpn junction is present in the device. A current flows at the region where the contact hole 18 is produced because the n-Al$_{0.10}$Ga$_{0.90}$As contact layer 16 is converted into the p+ region due to Zn diffusion and only a pn junction is formed between the p-Al$_{0.06}$Ga$_{0.94}$As active layer 14 and the n-Al$_{0.35}$Ga$_{0.65}$As first cladding layer 13 which are biased by the bias voltage in a forward direction. Thus, the current flows along the current path 19 shown in FIG. 5. Holes and electrons injected into the p-Al$_{0.06}$Ga$_{0.94}$As active layer 14 due to the current 19 recombine and radiate light. The light has an energy corresponding to the energy band gap of the material constituting the active layer. For example, when the active layer is constituted by Al$_{0.06}$Ga$_{0.94}$As, the peak wavelength of the light is approximately 830 nm.

Figure 6:
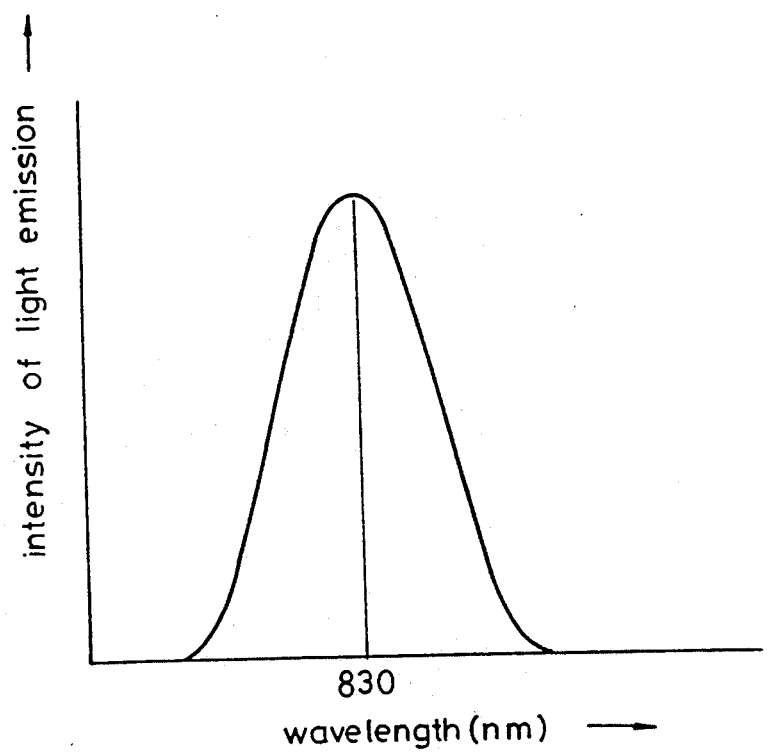
FIG. 6 is a diagram illustrating a light emission spectrum of a semiconductor light emitting device in accordance with the second embodiment of the present invention.

In this second embodiment, the n-Ge buffer layer is disposed on the n-GaAs substrate 11. Ge has an indirect transition type energy band structure in which the extreme value of conduction band is not opposite to the extreme value of valence band, and the energy band gap thereof is smaller than that of Al$_{0.06}$Ga$_{0.94}$As constituting the active layer. Since the lattice constant of Ge is almost the same as that of GaAs, it can easily be grown on the GaAs substrate. The relaxation time of the radiative recombination in the indirect transition type semiconductor such as Ge is about one second even in the simplest band to band transition while the mean lifetime of the minority carriers is about 1 millisecond at the longest. Accordingly, the probability that a radiative recombination will occur is quite small as compared with that of the non-radiative recombination in the direct transition type semiconductor. Therefore, in this embodiment, the n-Ge buffer layer 32 is excited by the light spreading from the p-Al$_{0.06}$Ga$_{0.94}$As active layer 14 in a direction toward the substrate and electron-hole pairs are generated in the n-Ge buffer layer 32. Since the buffer layer 32 is an indirect transition type semiconductor, almost all the electron-hole pairs are subjected to non-radiative recombination and band to band transition light emission hardly occurs. As a result, light is emitted only from the active layer 14 and the light emission spectrum has no sub peak as shown in FIG. 6.

In the above-described second embodiment, the n-Ge buffer layer that has a smaller energy band gap than the energy of the light emitted from the active layer and an indirect transition type band structure. Therefore, the light generated in the active layer and spreading in a direction toward the substrate is absorbed by the buffer layer before reaching the substrate and the electron-hole pairs produced in the buffer layer excited by the light from the active layer do not cause an band to band transition light emission, thereby preventing a sub peak in the light emission spectrum of the semiconductor light emitting device. In addition, as compared with the semiconductor LED provided with a non-doped buffer layer, the series resistance of the element can be reduced, thereby reducing power consumption and preventing deterioration due to heat generation. This makes it possible to obtain an element having a long lifetime.

In the above-described embodiment, Ge is used as the buffer layer, but other indirect transition type semiconductor materials having a smaller energy band gap than the material constituting the active layer may be used.

A third embodiment of the present invention will be described.

Figure 7:
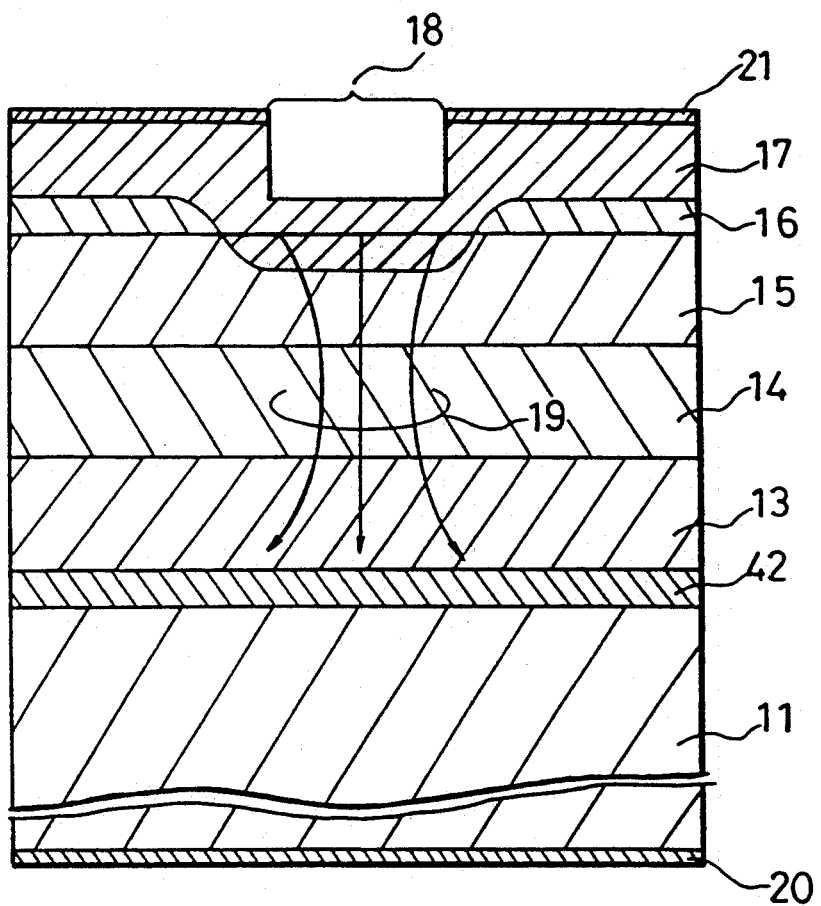
FIG. 7 is a cross sectional view illustrating a semiconductor light emitting device in accordance with a third embodiment of the present invention.

FIG. 7 is a cross-sectional view of a semiconductor light emitting device in accordance with the third embodiment of the present invention. In FIG. 7, the same reference numerals as those shown in FIGS. 1 and 2 designate the same or corresponding portions. Reference numeral 42 designates an n-GaAs buffer layer produced on a substrate 11 containing Se as an n type impurity to such an extent that the peak energy of PL light is almost the same as the light energy emitted from the active layer.

The thickness of the n-GaAs buffer layer 42 is about 0.2 micron the same as that of the buffer layer 12 of the first embodiment, and the thicknesses of other layers and the diameter and depth of the contact hole 18 are also the same as those of the first embodiment.

A description will be given of the operation.

A bias is applied between the Zn diffusion region 17 at the surface of the n-Al$_{0.10}$Ga$_{0.90}$As contact layer 16 and the n-GaAs substrate 11 with the former as positive side. No current flows at regions where the contact hole 18 is produced because a pnpn junction is present in the device. A current flows at the region where the contact hole 18 is produced because the n-Al$_{0.10}$Ga$_{0.90}$As contact layer 16 is converted into the p+ region due to Zn diffusion and only a pn junction is formed between the p-Al$_{0.06}$Ga$_{0.94}$As active layer 14 and the n-Al$_{0.35}$Ga$_{0.65}$As first cladding layer 13 which are biased by the bias voltage in a forward direction. Thus, the current flows in a current path 19 shown in FIG. 7. Holes and electrons injected into the p-Al$_{0.06}$Ga$_{0.94}$As active layer 14 due to the current 19 recombine and radiate light. The light has an energy corresponding to the energy band gap of the material constituting the active layer. For example, when the active layer is constituted by Al$_{0.06}$Ga$_{0.94}$As, the peak wavelength of the light is approximately 830 nm.

Figure 8:
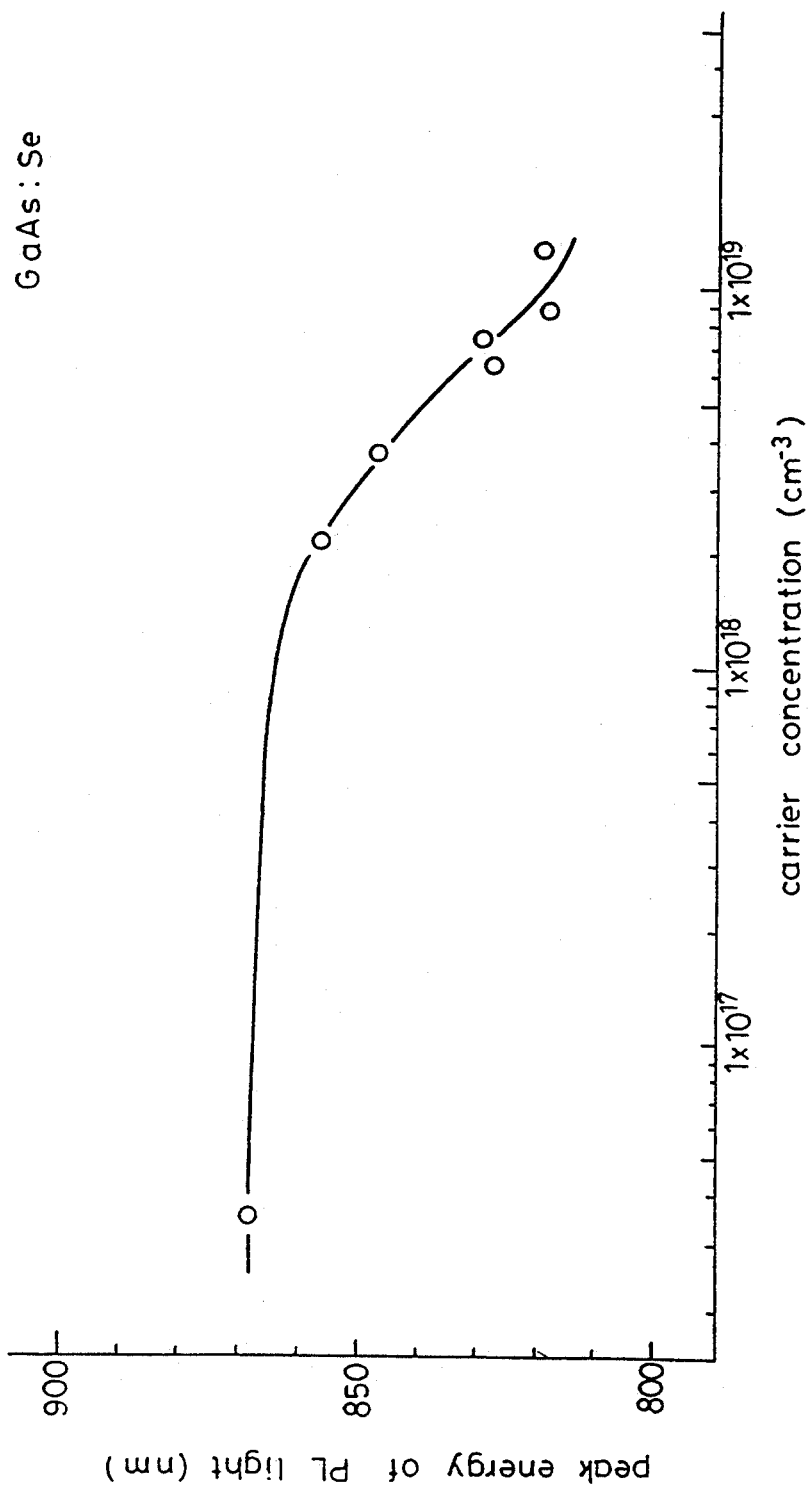
FIG. 8 is a diagram showing the relation between the peak wavelength of PL light and the carrier concentration in n-GaAs.

In this third embodiment, disposed on the n-GaAs substrate 11 is the n-GaAs buffer layer 42 containing an n type dopant impurity to such an extent that the peak energy of PL light is almost the same as that of the light emitted from the active layer. FIG. 8 shows the relation between the peak wavelength of PL light and the carrier concentration in band to band transition in the n-GaAs. As shown in FIG. 8, when the carrier concentration exceeds $2 \sim 3 \times 10^{18}$cm$^{-3}$, the peak wavelength of PL light gradually decreases to about 820 nm at a carrier concentration of $1 \times 10^{19}$cm$^{-3}$. The peak wavelength of PL light of 830 nm can be obtained at a carrier concentration of $7 \times 10^{18}$cm$^{-3}$.

In this embodiment the n-GaAs buffer layer 42 is excited by the light spreading from the p-Al$_{0.06}$Ga$_{0.94}$As active layer 14 in a direction toward the substrate and the electron-hole pairs are generated in the n-GaAs buffer layer 42. However, since the carrier concentration of the buffer layer 42 is made $7 \times 10^{18}$cm$^{-3}$, the peak wavelength of PL light radiated by the recombinations of electron-hole pairs is 830 nm, which is equal to the peak energy of the light emitted from the p-Al$_{0.06}$Ga$_{0.94}$As active layer 14. As a result, the light emission spectrum of the light emitting device has only one peak.

Figure 9:
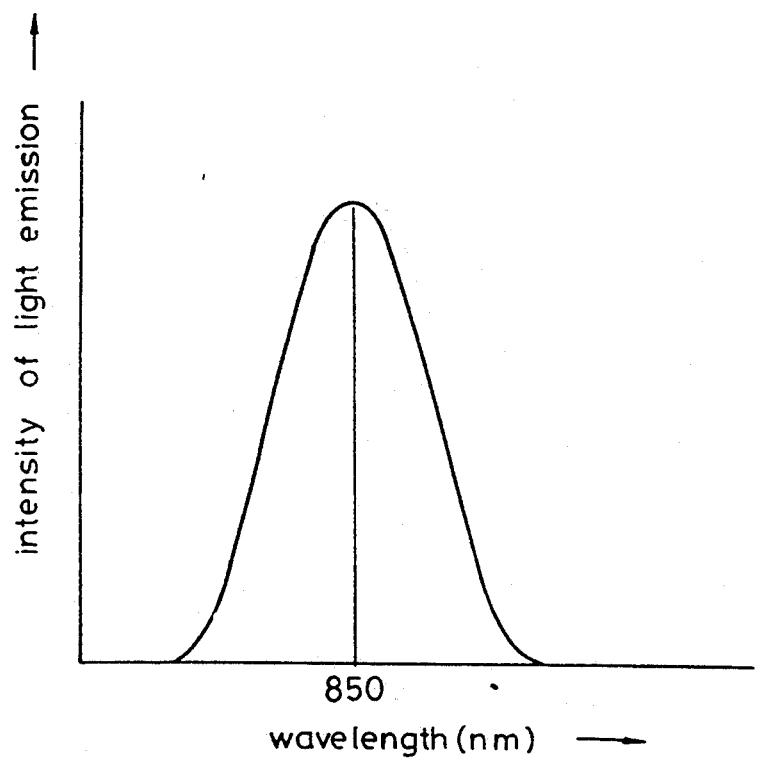
FIG. 9 is a diagram illustrating the light emission spectrum of a semiconductor light emitting device in accordance with a modification of the third embodiment of the present invention.
Figure 10:
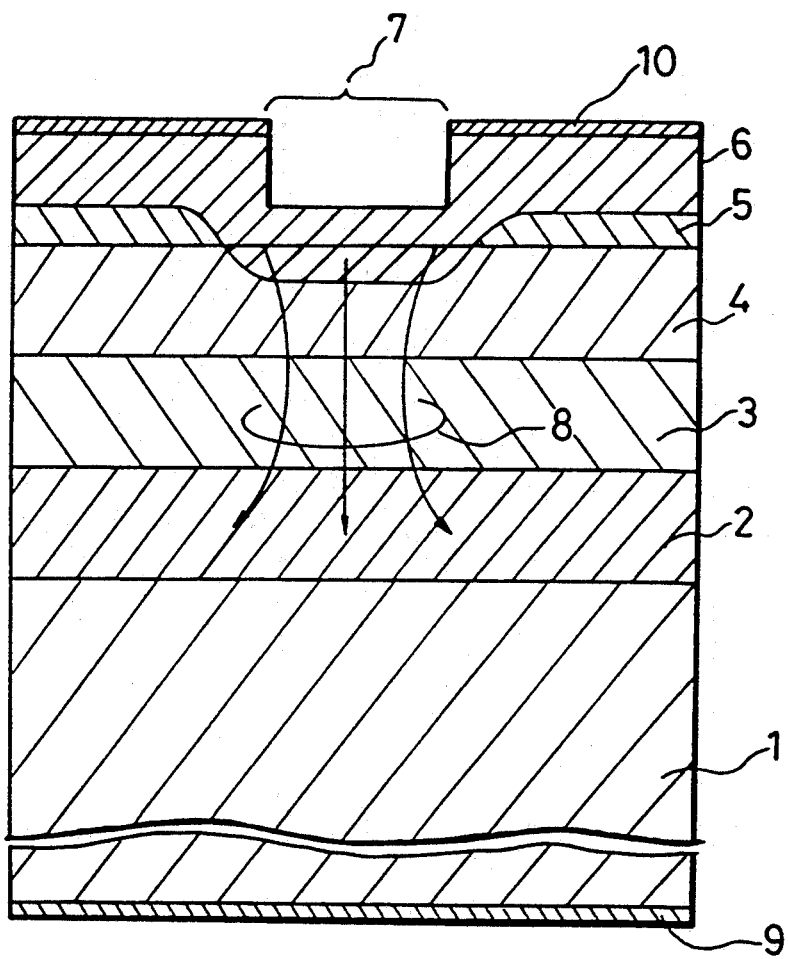
FIG. 10 is a cross-sectional view illustrating a prior art semiconductor light emitting device.
Figure 11:
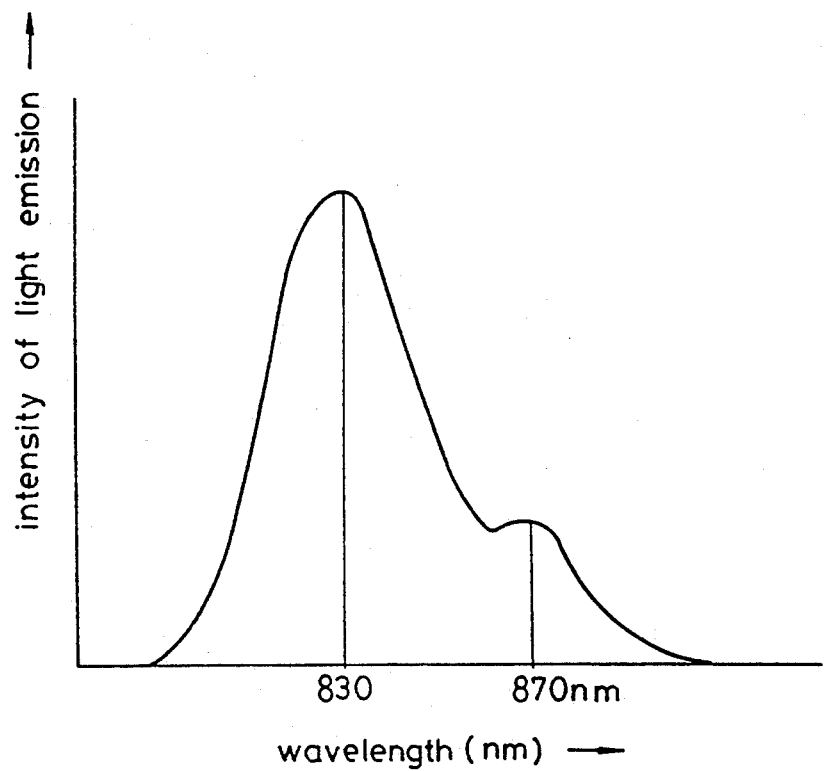
FIG. 11 is a diagram illustrating the light emission spectrum of the semiconductor light emitting device of FIG. 10.
Figure 12:
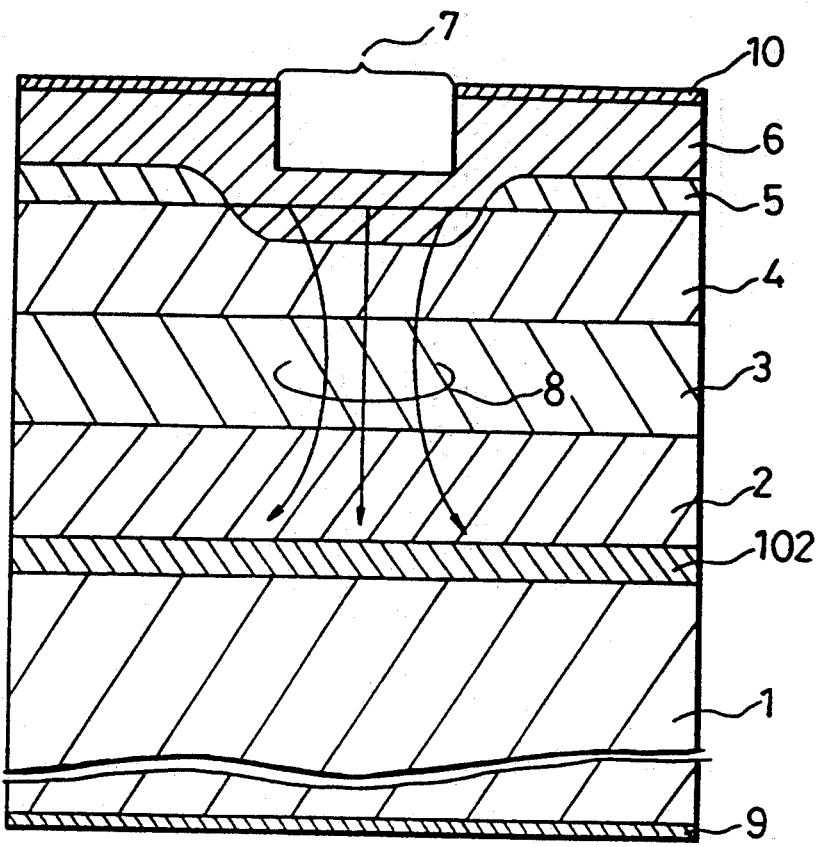
FIG. 12 is a cross-sectional view illustrating another prior art semiconductor LED.

While in the above-described embodiments the active layer comprises Al$_{0.06}$Ga$_{0.94}$As producing a peak wavelength of about 830 nm, the effect of this third embodiment is more significant when material having a longer peak wavelength in the light emission spectrum is used for the active layer. As shown in FIG. 3, the intensity of PL light is extremely low at a carrier concentration of $7 \times 10^{18}$cm$^{-3}$ and the sub peak in the light emission spectrum can be suppressed without the effect of the third embodiment. However, when Al$_{0.03}$Ga$_{0.97}$As producing a peak wavelength of about 850 nm is used for the active layer, a peak wavelength of PL light of about 850 nm can be obtained when the carrier concentration of the n-GaAs buffer layer 43 is set to $3 \times 10^{18}$cm$^{-3}$, and at this time the light emission spectrum of the light emitting device has only one peak as shown in FIG. 9. In addition, although the intensity of PL light is large at a carrier concentration of $3 \times 10^{18}$cm$^{-3}$ in the buffer layer. When the sub peak cannot be prevented only by the effect of the first embodiment, the effect of this third embodiment can provide a semiconductor light emitting device emitting light having no sub peak in the spectrum, which can be utilized for optical communication, as shown in FIG. 3.

In the above-described third embodiment, the n-GaAs buffer layer is disposed on the n-GaAs substrate, containing an n type impurity to such an extent that the peak energy of PL light is almost the same as that of the light emitted from the active layer, so that the light generated in the active layer and spreading in a direction toward the substrate is absorbed by the buffer layer before reaching the substrate, and further, the peak wavelength of PL light which is radiated by the recombinations of the electron-hole pairs generated in the buffer layer by the light from the active layer is the same as that of the light emitted from the active layer, thereby preventing a sub peak in the light emission spectrum of the light emitting device. In addition, even if the growth equipment is contaminated by an impurity, it hardly affect the growth of a layer having a high carrier concentration, and this eases repetitive production and enhances the productivity. As compared with the prior art light emitting diode including the non-doped buffer layer between the substrate and the cladding layer, the annealing process after producing the buffer layer has less influence, whereby the emission characteristic is scarcely deteriorated. Furthermore, as compared with the light emitting device including the non-doped buffer layer, the series resistance of the element can be reduced, thereby reducing power consumption and preventing element deterioration due to heat generation. This makes it possible to produce an element having a long lifetime.

In the above-described embodiment GaAs is used as the buffer layer, but AlGaAs, which has a smaller energy band gap than that of the material constituting the active layer, may be used.

As is evident from the foregoing description, according to the invention, an $Al_zGa_{1-z}As$ ($0 \leq z$) buffer layer is disposed between the GaAs substrate and the AlGaAs cladding layer disposed at the substrate side, containing an impurity at such a high concentration that the buffer layer has a smaller energy band gap than the energy of the light emitted from the light emitting device and that the intensity of PL light generated by band to band transitions is significantly reduced. Therefore, a long lifetime semiconductor light emitting device having no sub peak in the spectrum of the emission light can be easily produced with good productivity.

According to the invention, a buffer layer that has a smaller energy band gap than the energy of the light emitted from the light emitting device and has an indirect transition type energy band structure is disposed between the GaAs substrate and the AlGaAs cladding layer at the substrate side. Therefore, a long lifetime semiconductor light emitting device having no sub peak in the spectrum of the emission light can be easily produced with good productivity.

According to the invention, the $Al_zGa_{1-z}As$ ($0 \leq z$) buffer layer is disposed between the GaAs substrate and the AlGaAs cladding layer at the substrate side, containing an impurity to such an extent that the peak energy of PL light is almost the same as that of the light emitted from the light emitting device. Therefore, a long lifetime semiconductor light emitting device having no sub peak in the emission spectrum can be easily produced with good productivity.

What is claimed is:

1. An AlGaAs/GaAs system light emitting device comprising:
   a GaAs substrate of a first conductivity type;
   a first conductivity type $Al_yGa_{1-y}As$ first cladding layer, an $Al_xGa_{1-x}As$ ($0<x<y$) active layer having an energy band gap with an energy, and an $Al_yGa_{1-y}As$ second cladding layer having a second conductivity type opposite to the first conductivity type successively disposed on said substrate for generating light in said active layer having an energy approximately the same as the energy of the energy band gap of said active layer, the light generated in said active layer stimulating photoluminescent light emission from said substrate; and
   an $Al_zGa_{1-z}As$ ($0 \leq z$) buffer layer disposed between said GaAs substrate and said first cladding layer containing a dopant impurity producing the first conductivity type and in a concentration greater than $5 \times 10^{18}$ cm$^{-3}$ to reduce the generation of photoluminescent light in said substrate, said buffer layer having an energy band gap smaller than the energy band gap of said active layer.

2. The semiconductor light emitting device of claim 1 wherein said buffer layer comprises GaAs.

3. The semiconductor light emitting device of claim 2 wherein the carrier concentration of said GaAs substrate is $1 \times 10^{18}$ cm$^{-3} \sim 3 \times 10^{18}$ cm$^{-3}$ and the carrier concentration of said buffer layer is more than $5 \times 10^{18}$ cm$^{-3}$.

4. The semiconductor light emitting device of claim 3 wherein the carrier concentration of said buffer layer is approximately $1 \times 10^{19}$ cm$^{-3}$.

5. The semiconductor light emitting device of claim 4 wherein said buffer layer has a thickness of approximately 0.2 micron.

6. The semiconductor light emitting device of claim 2 wherein the first conductivity type is n-type.

7. An AlGaAs/GaAs system light emitting device comprising:
   a GaAs substrate of a first conductivity type;
   a first conductivity type $Al_yGa_{1-y}As$ first cladding layer, an $Al_xGa_{1-x}As$ ($0<x<y$) active layer having an energy band gap with an energy, and an $Al_yGa_{1-y}As$ second cladding layer having a second conductivity type opposite to the first conductivity type successively disposed on said substrate for generating light in said active layer having an energy approximately the same as the energy of the energy band gap of said active layer, the light generated in said active layer stimulating photoluminescent light emission from said substrate; and
   a GaAs buffer layer disposed between said GaAs substrate and said first cladding layer containing a dopant impurity producing the first conductivity type in a sufficiently high concentration that a peak energy of photoluminescent light generated in said substrate is almost the same as the energy of light generated in said active layer wherein x is approximately 0.06, the peak energy of the emitted photoluminescent light corresponds to a wavelength of approximately 830 nm, and the carrier concentration of said GaAs buffer layer is approximately $7 \times 10^{18}$ cm$^{-3}$.

8. The semiconductor light emitting device of claim 7 wherein the carrier concentration of said GaAs substrate is $1 \times 10^{18}$ cm$^{-3} \sim 3 \times 10^{18}$ cm$^{-3}$.

9. The semiconductor light emitting device of claim 7 wherein said buffer layer has a thickness of approximately 0.2 micron.

10. The semiconductor light emitting device of claim 7 wherein the first conductivity type is n-type.

11. A semiconductor light emitting device comprising:
    a GaAs substrate of a first conductivity type;
    a GaAs buffer layer of the first conductivity type containing a dopant impurity in a concentration greater than $5 \times 10^{18}$ cm$^{-3}$ disposed on the substrate and having an energy band gap;
    a first conductivity type $Al_yGa_{1-y}As$ first cladding layer, an $Al_xGa_{1-x}As$ ($0<x<y$) active layer having an energy band gap with an energy, and an $Al_yGa_{1-y}As$ second cladding layer having a second conductivity type opposite to the first conductivity type successively disposed on the buffer layer for generating light in the active layer having an energy approximately the same as the energy of the energy band gap of the active layer, the light generated in the active layer stimulating photoluminescent light emission from the substrate, the energy band gap of the buffer layer being smaller than the energy band gap of the active layer; and
    a first conductivity type GaAs contact layer disposed on the second cladding layer and having a surface opposite the second cladding layer, the contact layer including a contact hole through which light generated in the active layer is emitted transverse to the active layer, the hole extending from the surface into and partially through the contact layer, the contact layer including a second conductivity type region extending from the surface through part of the contact layer and reaching the second cladding layer opposite the contact hole wherein the buffer layer is $Al_zGa_{1-z}As$ ($0 \leq z$) and contains a dopant impurity in a sufficiently high concentration to reduce the generation of photoluminescent light in the substrate.

12. The semiconductor light emitting device of claim 11 wherein the buffer layer is GaAs.

13. The semiconductor light emitting device of claim 12 wherein the first conductivity type is n-type.

14. A semiconductor light emitting device comprising:
- a GaAs substrate of a first conductivity type having a carrier concentration of $1 \times 10^{18}$ cm$^{-3}$ ~ $3 \times 10^{18}$ cm$^{-3}$;
- a GaAs buffer layer of the first conductivity type having a carrier concentration of more than $5 \times 10^{18}$ cm$^{-3}$ disposed on the substrate and having an energy band gap;
- a first conductivity type $Al_yGa_{1-y}As$ first cladding layer, an $Al_xGa_{1-x}As$ ($0<x<y$) active layer having an energy band gap with an energy, and an $Al_yGa_{1-y}As$ second cladding layer having a second conductivity type opposite to the first conductivity type successively disposed on the buffer layer for generating light in the active layer having an energy approximately the same as the energy of the energy band gap of the active layer, the light generated in the active layer stimulating photoluminescent light emission from the substrate, the energy band gap of the buffer layer being smaller than the energy band gap of the active layer; and
- a first conductivity type GaAs contact layer disposed on the second cladding layer and having a surface opposite the second cladding layer, the contact layer including a contact hole through which light generated in the active layer is emitted transverse to the active layer, the hole extending from the surface into and partially through the contact layer, the contact layer including a second conductivity type region extending from the surface through part of the contact layer and reaching the second cladding layer opposite the contact hole wherein the buffer layer is $Al_zGa_{1-z}As$ ($0<z$) and contains a dopant impurity in a sufficiently high concentration to reduce the generation of photoluminescent light in the substrate.

15. The semiconductor light emitting device of claim 14 wherein the carrier concentration of the buffer layer is approximately $1 \times 10^{19}$ cm$^{-3}$.

16. The semiconductor light emitting device of claim 15 wherein the buffer layer has a thickness of approximately 0.2 micron.

* * * * *